US010784352B2

(12) United States Patent
Gardner et al.

(10) Patent No.: US 10,784,352 B2
(45) Date of Patent: Sep. 22, 2020

(54) METHOD TO ACHIEVE A UNIFORM GROUP IV MATERIAL LAYER IN AN ASPECT RATIO TRAPPING TRENCH

(71) Applicant: Intel Corporation, Santa Clara, CA (US)

(72) Inventors: Sanaz K. Gardner, Hillsboro, OR (US); Willy Rachmady, Beaverton, OR (US); Van H. Le, Portland, OR (US); Matthew V. Metz, Portland, OR (US); Seiyon Kim, Portland, OR (US); Ashish Agrawal, Santa Clara, CA (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/779,442

(22) PCT Filed: Dec. 26, 2015

(86) PCT No.: PCT/US2015/000503
§ 371 (c)(1),
(2) Date: May 25, 2018

(87) PCT Pub. No.: WO2017/111873
PCT Pub. Date: Jun. 29, 2017

(65) Prior Publication Data
US 2018/0261498 A1    Sep. 13, 2018

(51) Int. Cl.
*H01L 29/267* (2006.01)
*H01L 29/78* (2006.01)
(Continued)

(52) U.S. Cl.
CPC .......... *H01L 29/267* (2013.01); *H01L 21/762* (2013.01); *H01L 21/76816* (2013.01);
(Continued)

(58) Field of Classification Search
CPC ... H01L 27/0886; H01L 29/785; H01L 29/26; H01L 29/267; H01L 21/823431;
(Continued)

(56) References Cited

U.S. PATENT DOCUMENTS 8,183,627 B2 *  5/2012  Currie ............. H01L 21/823807
                                                257/329
8,524,545 B2 *  9/2013  Anderson ........... H01L 21/3081
                                                257/350
(Continued)

OTHER PUBLICATIONS

International Search Report and Written Opinion dated Mar. 16, 2016 for International Application No. PCT/US2015/000503, 9 pages.

*Primary Examiner* — Scott B Geyer
(74) *Attorney, Agent, or Firm* — Schwabe, Williamson & Wyatt, P.C.

(57) ABSTRACT

Related fields of the present disclosure are in the field of transistor devices, and in particular, FinFET device structures formed using aspect ratio trapping trench (ART) process techniques. For example, a FinFET device consistent with the present disclosure comprises a first fin structure including a first upper fin portion atop a first lower fin portion and a second fin structure including a second upper fin portion atop a second lower fin portion. The first and second upper fin structures include a Group IV material and the first and second lower fin structures include a Group III-V material.

25 Claims, 6 Drawing Sheets

(51) Int. Cl.
*H01L 27/088* (2006.01)
*H01L 21/762* (2006.01)
*H01L 21/768* (2006.01)
*H01L 29/10* (2006.01)
*H01L 29/66* (2006.01)

(52) U.S. Cl.
CPC ...... *H01L 27/0886* (2013.01); *H01L 29/1054* (2013.01); *H01L 29/66795* (2013.01); *H01L 29/785* (2013.01)

(58) Field of Classification Search
CPC ........... H01L 21/823821; H01L 21/845; H01L 27/0924; H01L 27/10826; H01L 27/10879; H01L 27/1211
See application file for complete search history.

(56) References Cited

U.S. PATENT DOCUMENTS

| | | | | |
|---|---|---|---|---|
| 8,836,016 | B2* | 9/2014 | Wu | H01L 29/66795 257/329 |
| 9,379,243 | B1* | 6/2016 | Hashemi | H01L 29/7849 |
| 9,502,265 | B1* | 11/2016 | Jiang | H01L 21/31155 |
| 2008/0099785 | A1 | 5/2008 | Bai et al. | |
| 2011/0163354 | A1 | 7/2011 | Wells et al. | |
| 2012/0326168 | A1 | 12/2012 | Adam et al. | |
| 2013/0001591 | A1* | 1/2013 | Wu | H01L 21/823821 257/77 |
| 2013/0168771 | A1* | 7/2013 | Wu | H01L 27/1211 257/351 |
| 2014/0110825 | A1 | 4/2014 | Parthasarathy et al. | |
| 2014/0197456 | A1 | 7/2014 | Wang et al. | |
| 2014/0264488 | A1* | 9/2014 | Fronheiser | H01L 29/66795 257/288 |
| 2014/0291772 | A1 | 10/2014 | Rachmady et al. | |
| 2014/0367800 | A1* | 12/2014 | Lee | H01L 27/12 257/402 |
| 2015/0035133 | A1 | 2/2015 | Wong | |
| 2015/0076620 | A1 | 3/2015 | Waldron et al. | |
| 2015/0214365 | A1* | 7/2015 | Xie | H01L 29/7842 257/369 |
| 2015/0214369 | A1* | 7/2015 | Fronheiser | H01L 29/0847 257/192 |
| 2015/0279947 | A1* | 10/2015 | Waldron | H01L 29/04 257/401 |
| 2015/0318354 | A1* | 11/2015 | Yin | H01L 29/785 257/288 |
| 2015/0380410 | A1* | 12/2015 | Ching | H01L 29/0649 257/192 |
| 2016/0064289 | A1* | 3/2016 | Xiao | H01L 21/8258 257/369 |
| 2016/0093619 | A1* | 3/2016 | Cheng | H01L 27/0924 257/369 |
| 2016/0141373 | A1* | 5/2016 | Cantoro | H01L 21/02524 257/27 |
| 2016/0211261 | A1* | 7/2016 | Liu | H01L 27/0924 |
| 2016/0211372 | A1* | 7/2016 | Yu | H01L 29/165 |
| 2017/0005168 | A1* | 1/2017 | Doornbos | H01L 29/0847 |
| 2018/0138289 | A1* | 5/2018 | Rachmady | H01L 29/66545 |

* cited by examiner

METHOD TO ACHIEVE A UNIFORM GROUP IV MATERIAL LAYER IN AN ASPECT RATIO TRAPPING TRENCH

CROSS REFERENCE TO RELATED APPLICATIONS

The present application is a national phase entry under 35 U.S.C. § 371 of International Application No. PCT/US2015/000503, filed Dec. 26, 2015, entitled "A METHOD TO ACHIEVE A UNIFORM GROUP IV MATERIAL LAYER IN AN ASPECT RATIO TRAPPING TRENCH", which designated, among the various States, the United States of America. The PCT/US2015/000503 Application is hereby incorporated by reference in its entirety.

FIELD

Related fields of the present disclosure are in the field of transistor devices, and in particular, FinFET device structures formed using aspect ratio trapping (ART) process techniques.

BACKGROUND

Conventional methods for fabricating multi-layer FinFET devices include forming fin materials within ART trenches by employing in situ methods. In situ methods used to form these devices typically involve non-uniform growth of multi-layer fins within the ART trenches. Non-uniform growth, however, can cause performance problems such as down-stream issues where the sidewalls become blocked for wet etch gate-all-around (GAA) release.

A need exists for a suitable method to fabricate a uniform fin material within ART trenches. The present disclosure addresses this need.

BRIEF DESCRIPTION OF THE DRAWINGS

To facilitate understanding, identical reference numerals have been used, where possible, to designate identical elements that are common to the drawings. The drawings are not to scale and the relative dimensions of various elements in the drawings are depicted schematically and not necessarily to scale. The techniques of the present disclosure may be readily understood by considering the following detailed description in conjunction with the accompanying drawings, in which.

DETAILED DESCRIPTION

Figure 1:
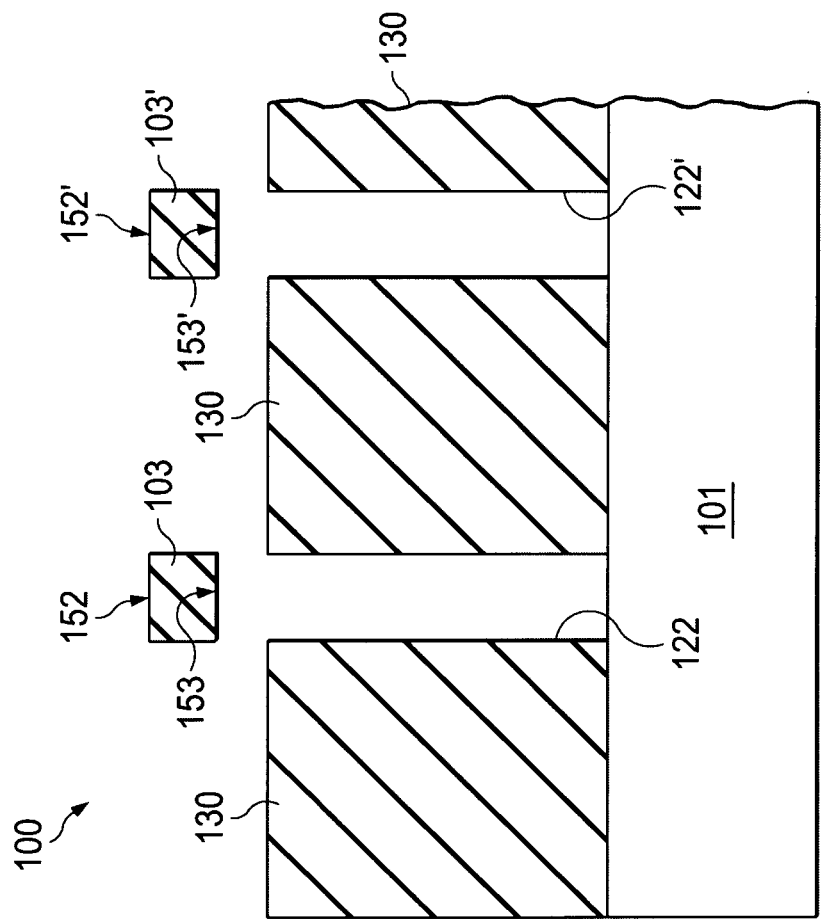
FIG. 1 is a schematic diagram of an exemplary multi-layer FinFET device consistent with the present disclosure.

The description of the different advantageous embodiments has been presented for purposes of illustration, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

Epitaxy refers to the deposition of a crystalline overlayer on a crystalline substrate. The overlayer may be referred to as an epitaxial (EPI) film or EPI layer. EPI films may be grown from gaseous or liquid precursors. Because the substrate acts as a seed crystal, the deposited film may lock into one or more crystallographic orientations with respect to the substrate crystal. If the overlayer either forms a random orientation with respect to the substrate or does not form an ordered overlayer, it is termed non-EPI growth. If an EPI film is deposited on a substrate of the same composition, the process is called homoepitaxy; otherwise it is called heteroepitaxy which is a type of epitaxy performed with materials that are different from each other. In heteroepitaxy, a crystalline film grows on a crystalline substrate or film of a different material. Heteroepitaxy technology is often used to grow crystalline films of materials for which crystals cannot otherwise be obtained and to fabricate integrated crystalline layers of different materials. Examples include germanium (Ge) on gallium arsenide (GaAs) and the like.

Epitaxy is used in silicon-based manufacturing processes for bipolar junction transistors (BJTs) and modern complementary metal-oxide-semiconductors (CMOS). Epitaxy may be used in the formation of non-planar transistors such as a FinFET. A FinFET is a transistor built around a thin strip of semiconductor material (referred to as a "fin"). The transistor includes the standard field effect transistor (FET) nodes/components: gate, gate dielectric, source region, and drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist such as "double-gate" FinFETs in which the conductive channel principally resides only along both sidewalls of the fin and not along the top side of the fin, and Gate-all-around FETs wherein the gate material surrounds the channel region on all sides. Gate-all-around FETs can have two or four gates depending on the device's design. Manufacturing issues for EPI layer growth include control of the amount and uniformity of the EPI layer's resistivity and thickness.

Aspect ratio trapping (ART) is based on threading dislocations that propagate upwards at a specific angle. In ART, a trench is made with a high enough aspect ratio such that defects terminate on sidewalls of the trench whereas any layer above the terminations is defect free. More specifically, ART includes trapping defects along sidewalls of shallow trench isolation (STI) regions by making the height (H) of the trench larger than its width (W) such that the H/W ratio is at least 2.0. In an embodiment, this ratio gives the minimum limit for ART to block defects within a buffer layer.

Applicant has discovered various issues concerning various forms of non-uniformity such as the multi-layer fins within the ART trench which causes the sidewalls to become blocked for wet etch, Gate-all-around release.

However, embodiments achieve uniform layers in ART trenches. For example, embodiments provide wet etching to uniformly recess sub-fin materials. The wet etch may be performed ex-situ (after a layer is grown and polished) as opposed to in situ growth (while a layer is being grown). In other words, after the sub-fin is formed, the sub-fin is then etched to flatten and even out its top surface.

Embodiments also provide selective EPI deposition processes to conformally grow uniform layers such as Group IV materials (e.g., Ge) which are formed atop of Group III-V materials (e.g., GaAs). Embodiments further provide bilayer stacks (e.g., GaAs/Ge) inside narrow ART trenches with a uniform layer thickness (e.g., Ge) across a single fin's width and length.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics.

Some embodiments may have some, all, or none of the features described for other embodiments. "First", "second", "third" and the like describe a common object and indicate different instances of like objects are being referred to. Such adjectives do not imply that objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

FIG. 1 is a schematic diagram of an exemplary multi-layer FinFET device consistent with the present disclosure. In an embodiment, fin portions 103, 103' of a FinFET device have top surfaces 152, 152' that are generally coplanar with one another, generally flat, and generally parallel to the substrate 101 and bottom surfaces 153, 153'. Top surfaces 152, 152' of fin portions 103, 103' may be flat/planar due to employing any of various polishing techniques. It should be noted that fin portions 103, 103' may be formed within ART trenches 122, 122' disposed within STI 130 as will be described in more detail below.

Figure 2B:
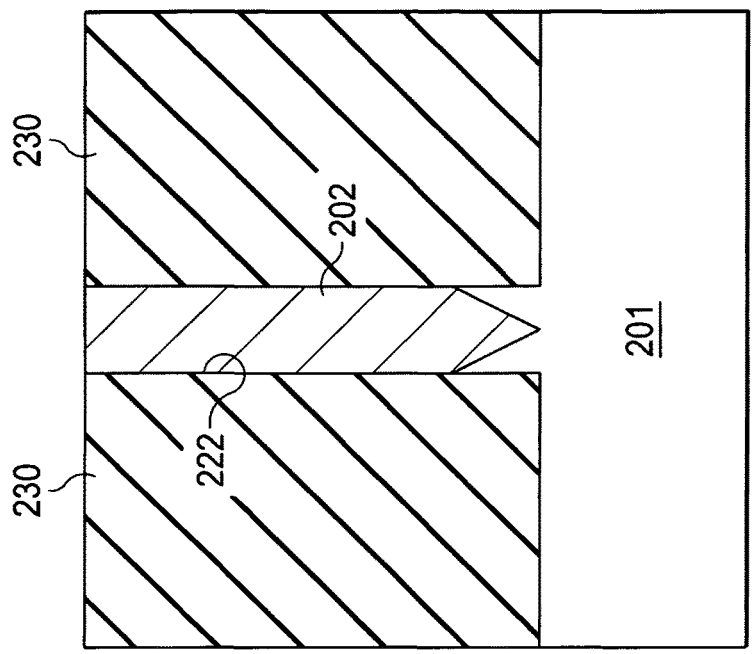
FIGS. 2A-2E are schematic diagrams of a process to achieve a uniform Group IV material layer.
Figure 2A:
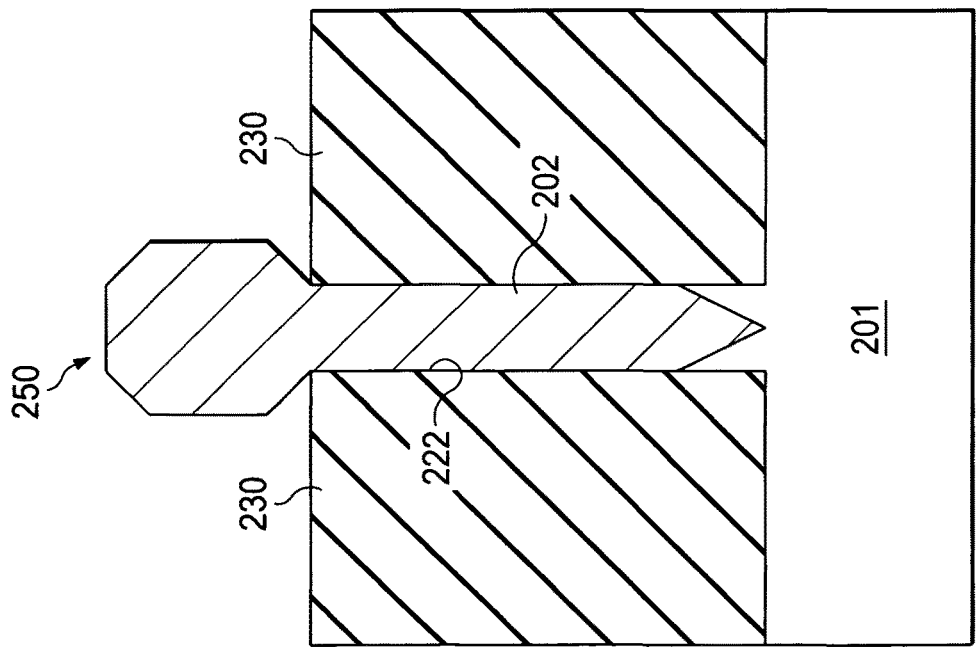

FIGS. 2A-2E are schematic diagrams depicting a process for forming a multi-layer fin structure. FIG. 2A depicts growth of a Group III-V material, such as a GaAs layer 202, which will eventually serve as sub-fin 202 to support a transistor gate channel. Sub-fin 202 is grown on substrate 201 and within ART trench 222 which are both disposed within STI 230. Any overgrowth 250 is removed as shown in FIG. 2B via polishing techniques (e.g., chemical mechanical polishing).

It should be noted that GaAs layer 202 may be doped. In an embodiment, GaAs layer 202 may have an n-type or p-type doping concentration between 1-5e18/cm$^3$ within a multi-layer FinFET.

Figure 2D:
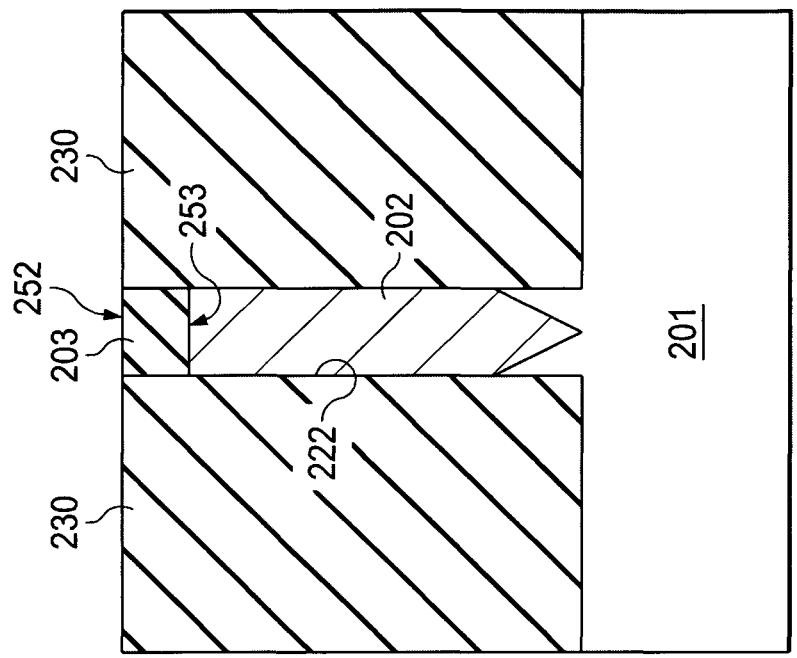
Figure 2C:
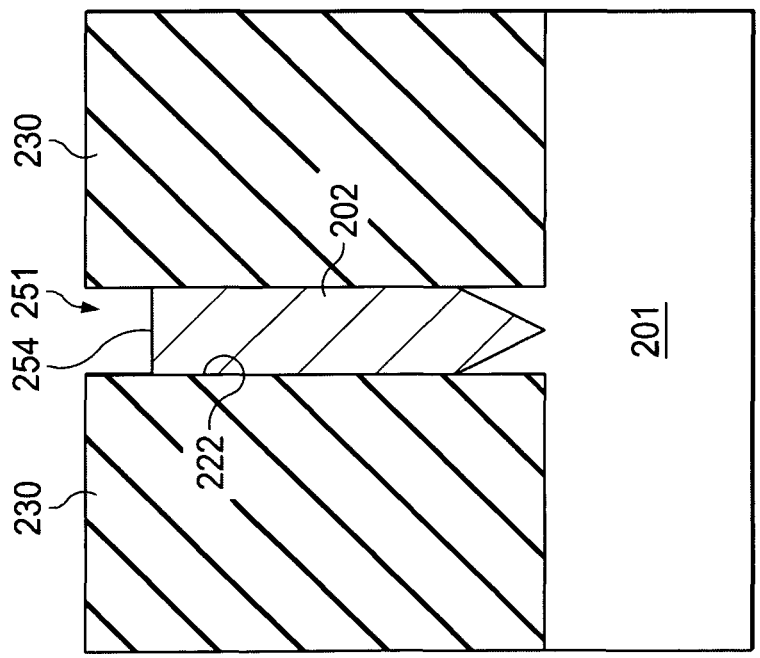

FIG. 2C shows that GaAs is further recessed to form recess 251 above sub-fin portion 202. A Group IV material such as Ge layer 203 may be grown within trench 222 and subsequently polished to form a flat upper surface 252 and flat lower surface 253 formed atop of the flat upper surface 254 of the GaAs sub-fin 202 as depicted in FIG. 2D. Advantageously, the lattice structures of GaAs and Ge are similar such that there is lattice matching between the material layers within the ART trenches 222. It should be further noted that Ge layer 203 may be doped. In an embodiment, Ge layer 203 may be intrinsic (for PMOS or NMOS) or may have a p-type doping (for NMOS) or n-type doping (for PMOS) concentration of 1-5e17/cm$^3$. Ge layer 203 may be doped with boron, arsenic, gallium, phosphorus, or any other suitable dopant.

For example, for a Ge layer 203 that serves as a PMOS device, the GaAs sub-fin 202 may be n-doped with a concentration of 1-5e18/cm$^3$ with silicon, germanium, or tellurium. The Ge layer 203 may be p-doped with boron, gallium, or the like in the source and drain regions. The Ge channel may be intrinsic or n-doped (1-5e17/cm$^3$) with phosphorus, arsenic, or the like.

Alternatively, for a NMOS device, the GaAs sub-fin 202 may be p-doped with a concentration of 1-5e18/cm$^3$ with carbon, magnesium, zinc, or the like. Ge layer 203 may be n-doped with phosphorus, arsenic, or the like in the source and drain regions. The Ge channel may be either intrinsic or p-doped (1-5e17/cm$^3$) with boron, gallium, or the like.

Figure 2E:
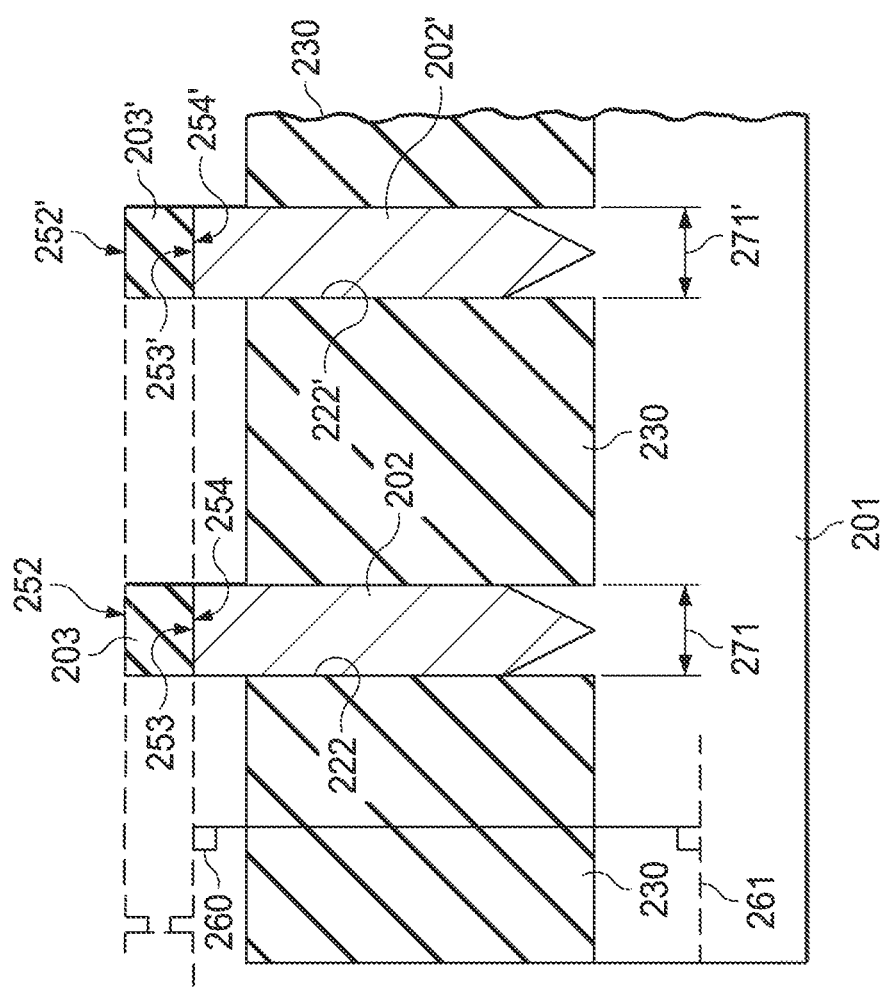

In FIG. 2E, STI 230 is recessed to expose Ge layer 203 and sub-fin 202 within ART trench 222. In addition, a second fin adjacent to the first fin that is the focus of FIGS. 2A-2D may be formed. Thereafter, in some embodiments, the GaAs sub-fins 202 are removed in a manner (e.g., via an etch process) consistent with a Gate-all-around release process. Referring back to FIG. 1, FinFET device 100 provides an exemplary illustration of a Ge nanowire structure fabricated by a Gate-all-around release process. While device structures like those shown in FIG. 2E show a Group IV material (e.g., Ge) atop a Group III-V material (GaAs), these devices may include additional layers.

As such, FIG. 2E depicts a device comprising a first fin structure including a first upper fin portion 203 atop a first lower sub-fin portion 202 and a second fin structure including a second upper fin portion 203' atop a second lower sub-fin portion 202'. The first and second upper fin portions 203, 203' have first and second bottom surfaces 253, 253', respectively, that directly contact first and second upper surfaces 254, 254' of the first and second lower fin portions 202, 202'. The first and second bottom surfaces 253, 253' are generally coplanar with one another and are generally flat.

For example, first and second bottom surfaces 253, 253' are each located along horizontal line 260 which is parallel to horizontal line 261 of substrate 201. In an embodiment, the first and second surfaces 253, 253' are flat and each extend across entire breaths 271, 271' of the first and second fin structures. The first and second upper surfaces 254, 254' are generally coplanar with one another and are generally flat (first and second upper surfaces 254, 254' are each located on line 260). The first and second upper fin structures 203, 203' include a Group IV material and the first and second lower fin structures 202, 202' include a Group III-V material. While many embodiments herein describe 203/202 and 203'/202' as stacks of Ge/GaAs material layers, other embodiments are not so limited and may include, for example, gallium arsenide phosphide (GaAsP) and silicon germanium (SiGe) material layers, respectively. In an embodiment, stack layers 203/202 and 203'/202' are epitaxial layers.

The first and second fin structures are at least partially included in first and second trenches 222, 222'. In an embodiment, first and second ART trenches 222, 222' each have generally equivalent aspect ratios (depth to width) that are at least 2:1. Alternative embodiments may employ aspect ratios such as, but not limited to, 1.5:1, 2.5:1, 3:1, 4:1, or the like. For example, the depth and width of ART trenches 222, 222' may be 80 nm and 40 nm, respectively.

Figure 3:
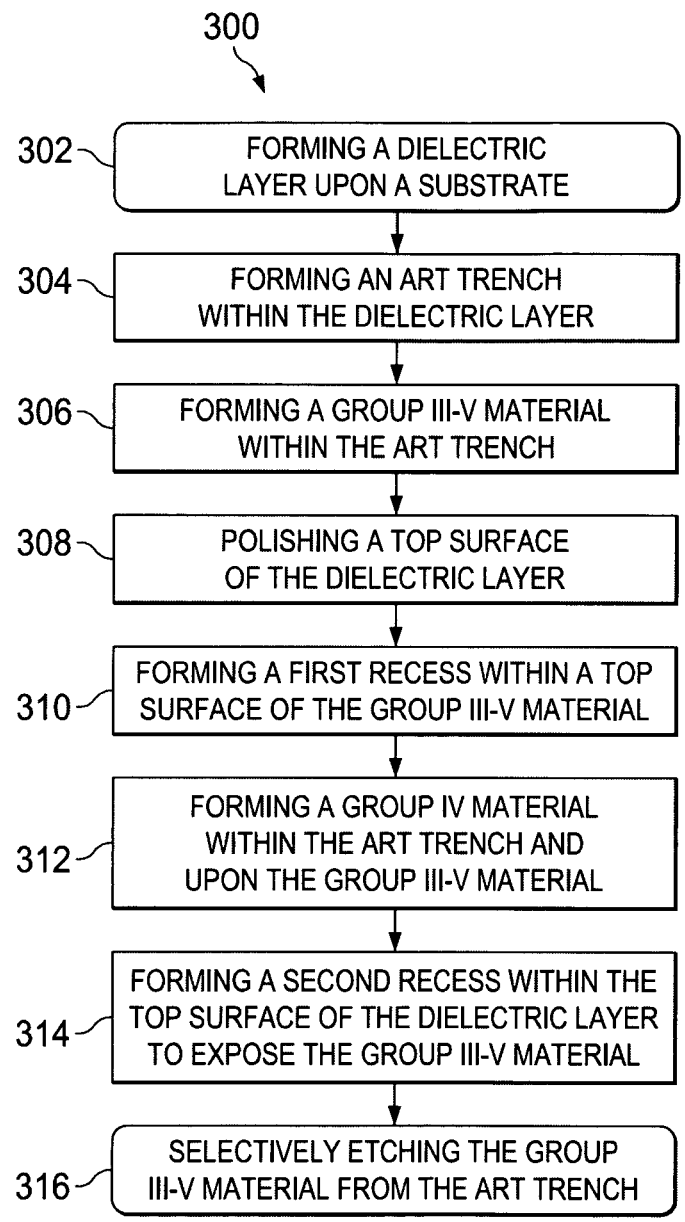
FIG. 3 is a flowchart for a method to achieve a uniform Group IV material layer within an ART trench.

FIG. 3 is a flowchart 300 for a method to achieve a uniform Group IV material layer within an ART trench. The device structures shown in FIG. 2 are referenced to further illustrate this method. Flowchart 300 begins with block 302—forming a dielectric layer upon a substrate. A dielectric layer may be formed by any suitable deposition techniques known in the art. The substrate may be doped (p-type) or may be intrinsic. Once the dielectric layer is formed upon the substrate, a trench is formed therein (block 304). In some implementations, an ART trench is etched within the substrate.

Next, a Group III-V material is formed within the ART trench (block 306). For example, in FIG. 2, a Group III-V material is deposited or grown within trench 222. After the Group III-V material is formed within the ART trench, the top surface of the dielectric layer (e.g., STI regions 230) is polished by any suitable technique known in the art (block 308) as shown in FIG. 2B.

Next, forming a first recess within a top surface of the Group III-V material (block 310). By way of example, as shown in FIG. 2C, a recess 251 is formed within a top portion of the GaAs material layer which makes up sub-fin 202.

After the first recess is formed, a Group IV material is formed within the ART trench and upon the Group III-V material (block 312). The Group III-V material may be grown or deposited within the recessed top surface. As shown in FIG. 2D, a Ge material layer 203 is formed within the first recess. Next, a second recess (or set of recesses) may be formed within a top surface of the dielectric layer to expose the Group III-V material (block 314). As shown in FIG. 2E, the second set of recesses expose the Group III-V material in addition to exposing the Group IV material.

Lastly, a selective etch technique is used to remove the Group III-V material from the ART trench (block 316). The end result of the selective etch process is a plurality of fin portions which consist of the Group IV material. For example, the device structure shown in FIG. 1 depicts fin portions 103, 103' that remain after a Gate-all-around technique is employed. In the embodiment shown, the fin portions 103, 103' consist of Ge.

Figure 4:
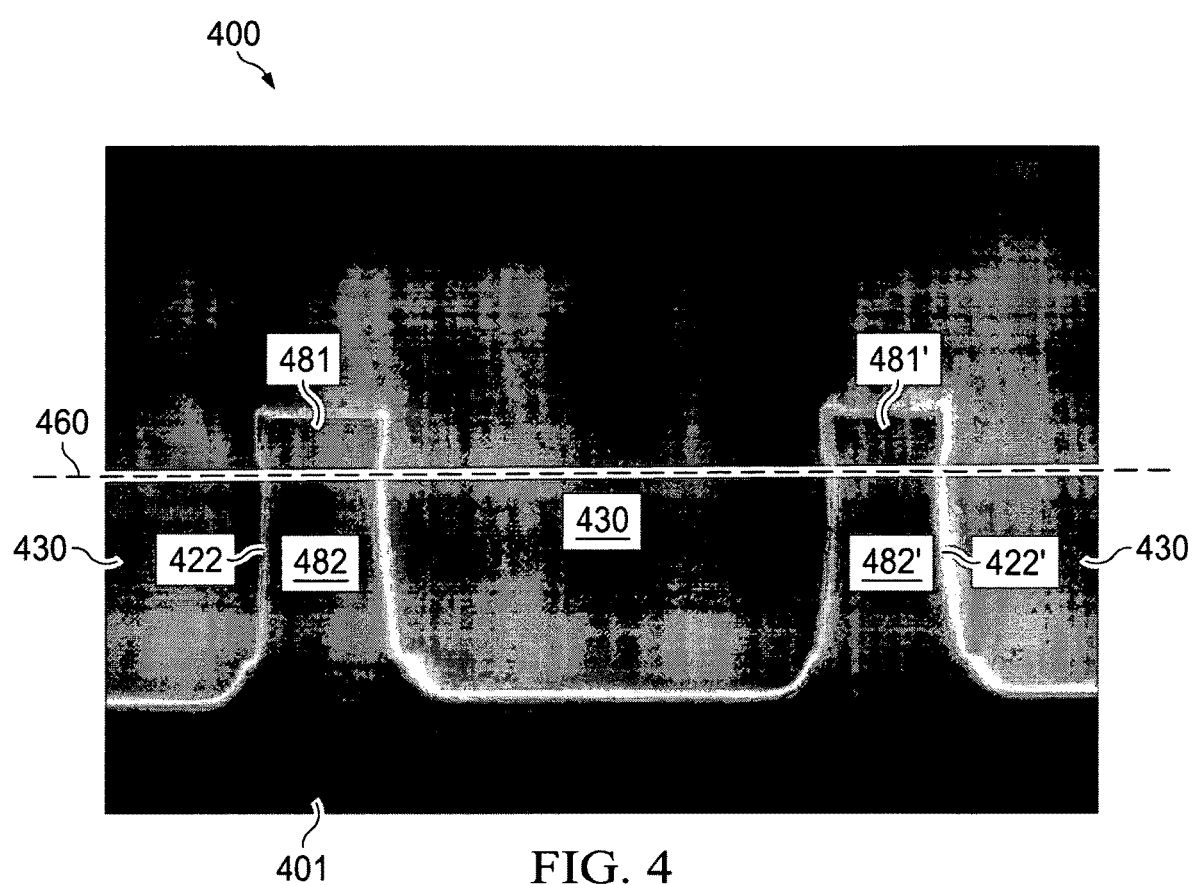
FIG. 4 is a SEM image of a multi-level fin having upper fin portions and lower fin portions within the ART trenches.

FIG. 4 is a SEM image of a multi-level fin 400 having upper fin portions 481, 481' and lower fin portions 482, 482' within respective ART trenches 422, 422' that are disposed within the dielectric regions 430. Line 460 shows a demarcation between upper fin portions 481, 481' and lower fin portions 482, 482'. Further shown are the ART trenches 422, 422' that are formed within a STI material 430 (on or over a substrate 401).

Various embodiments include a semiconductive substrate. Such a substrate may be a bulk semiconductive material that is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a method, comprising: (a) depositing a dielectric layer upon a substrate; (b) etching a trench (e.g., ART trench) within the dielectric layer; (c) depositing a Group III-V material within the trench; (d) polishing a top surface of the dielectric layer to remove a portion of the Group III-V material; (e) recessing a top surface of the Group III-V material within the trench; (f) depositing a Group IV material on the Group III-V material; (g) recessing the dielectric layer to expose the Group III-V material.

In Example 2 which refers to the method described in Example 1, further comprising selectively etching the Group III-V material from the trench.

In Example 3 which refers to the method described in Example 1, the trench is at least 2:1.

In Example 4 which refers to the method described in Example 1, the Group III-V material comprises gallium arsenide (GaAs) and the Group IV material comprises germanium (Ge).

In Example 5 which refers to the method described in Example 1, the height of the Group IV material within the recessed top surface is 5 nm.

In Example 6 which refers to the method described in Example 1, the substrate comprises silicon.

In Example 7 which refers to the method described in Example 1, the Group IV material is a NMOS or a PMOS device.

In Example 8 which refers to the method described in Example 1, the Group III-V material has an n-type or p-type doping concentration of 1-5e18/cm$^3$ and the Group IV material is intrinsic or has a p-type or n-type doping concentration of 1-5e17/cm$^3$.

In Example 9 which refers to the method described in Example 1, the method may optionally include depositing the Group IV material within the trench by utilizing a selective epitaxial deposition process.

In Example 10 which refers to the method described in Example 1, a first lattice structure of the Group IV material and a second lattice structure of the Group III-V material is substantially matched within the trench.

Example 11 includes a device comprising: a first fin structure having a first upper fin portion comprising a Group IV material on a first lower fin portion comprising a Group III-V material; and a second fin structure having a second upper fin portion comprising a Group IV material on a second lower fin portion comprising a Group III-V material. A top surface of the first lower fin portion is substantially coplanar with a top surface of the second lower fin portion.

In Example 12 which refers to the device described in Example 11, the fin structure is confined within an aspect ratio trapping trench (ART trench) which has an aspect ratio of at least 2:1.

In Example 13 which refers to the device described in Example 11, the Group IV material is a PMOS structure or NMOS structure.

In Example 14 which refers to the device described in Example 11, the Group IV material may be doped with at least one of boron, arsenic, gallium, or phosphorus.

In Example 15 which refers to the device described in Example 11, the Group III-V material is doped with at least one of carbon, magnesium, or zinc for p-doping and silicon, germanium, or tellurium for n-doping.

In Example 16 which refers to the device described in Example 11, the first upper fin portion has a lattice structure that substantially matches that of the first lower fin portion and the second upper fin portion has a lattice structure that substantially matches that of the second lower fin portion.

In Example 17 which refers to the device described in Example 11, the width of the first fin structure and the second fin structure are each in a range of 5-40 nm.

In Example 18 which refers to the device described in Example 11, the height of the first fin structure and the second fin structure are each in a range of 10-80 nm.

In Example 19 which refers to the device described in Example 11, the Group III-V material comprises gallium arsenide phosphide (GaAsP) and the Group IV material comprises silicon germanium (SiGe).

In Example 20 which refers to the device described in Example 11, the top of the first fin structure and the top of the second fin structure are substantially coplanar.

The preceding Description and accompanying Drawings describe examples of embodiments in some detail to aid understanding. However, the scope of protection may also include equivalents, permutations, and combinations that are not explicitly described herein. Only the claims appended here (along with those of parent, child, or divisional patents, if any) define the limits of the protected intellectual-property rights.

What is claimed is:

1. A device comprising:
   a first fin structure having a first upper fin portion comprising a Group IV material on a first lower fin portion comprising a Group III-V material, wherein the first fin structure is confined within an aspect ratio trapping trench (ART trench) which has an aspect ratio of at least 2:1; and
   a second fin structure having a second upper fin portion comprising the Group IV material on a second lower fin portion comprising the Group III-V material,
   wherein a top surface of the first lower fin portion is substantially coplanar with a top surface of the second lower fin portion, and
   wherein the Group IV material is doped with at least one of boron, arsenic, gallium, or phosphorus.

2. The device of claim 1, wherein the Group IV material is included within a PMOS or NMOS structure.

3. The device of claim 1, wherein the Group III-V material is doped with at least one of carbon, magnesium, or zinc for p-doping and silicon, germanium, or tellurium for n-doping.

4. The device of claim 1, wherein the first upper fin portion has a lattice structure that substantially matches that of the first lower fin portion and the second upper fin portion has a lattice structure that substantially matches that of the second lower fin portion.

5. The device of claim 1, wherein the width of the first fin structure and the second fin structure are each in a range of 5-40 nanometers (nm).

6. The device of claim 1, wherein the height of the first fin structure and the second fin structure are each in a range of 10-80 nanometers (nm).

7. The device of claim 1, wherein the Group III-V material comprises gallium arsenide phosphide (GaAsP) and the Group IV material comprises silicon germanium (SiGe).

8. The device of claim 1, wherein the top of the first fin structure and the top of the second fin structure are substantially coplanar.

9. A device comprising:
   a first fin structure having a first upper fin portion comprising a Group IV material on a first lower fin portion comprising a Group III-V material, wherein the first fin structure is confined within an aspect ratio trapping trench (ART trench) which has an aspect ratio of at least 2:1; and
   a second fin structure having a second upper fin portion comprising the Group IV material on a second lower fin portion comprising the Group III-V material,
   wherein a top surface of the first lower fin portion is substantially coplanar with a top surface of the second lower fin portion, and
   wherein the Group III-V material is doped with at least one of carbon, magnesium, or zinc for p-doping, or silicon, germanium, or tellurium for n-doping.

10. The device of claim 9, wherein the Group IV material is included within a PMOS or NMOS structure.

11. The device of claim 9, wherein the Group IV material is doped with at least one of boron, arsenic, gallium, or phosphorus.

12. The device of claim 9, wherein the first upper fin portion has a lattice structure that substantially matches that of the first lower fin portion and the second upper fin portion has a lattice structure that substantially matches that of the second lower fin portion.

13. The device of claim 9, wherein the width of the first fin structure and the second fin structure are each in a range of 5-40 nanometers (nm).

14. The device of claim 9, wherein the height of the first fin structure and the second fin structure are each in a range of 10-80 nanometers (nm).

15. The device of claim 9, wherein the Group III-V material comprises gallium arsenide phosphide (GaAsP) and the Group IV material comprises silicon germanium (SiGe).

16. The device of claim 9, wherein the top of the first fin structure and the top of the second fin structure are substantially coplanar.

17. A device comprising:
   a first fin structure having a first upper fin portion comprising a Group IV material on a first lower fin portion comprising a Group III-V material; and
   a second fin structure having a second upper fin portion comprising the Group IV material on a second lower fin portion comprising the Group III-V material,
   wherein a top surface of the first lower fin portion is substantially coplanar with a top surface of the second lower fin portion,
   wherein the Group IV material is doped with at least one of boron, arsenic, gallium, or phosphorus, and
   wherein the Group IV material is included within a PMOS or NMOS structure.

18. The device of claim 17, wherein the Group III-V material is doped with at least one of carbon, magnesium, or zinc for p-doping and silicon, germanium, or tellurium for n-doping.

19. The device of claim 17, wherein the first upper fin portion has a lattice structure that substantially matches that of the first lower fin portion and the second upper fin portion has a lattice structure that substantially matches that of the second lower fin portion.

20. The device of claim 17, wherein the top of the first fin structure and the top of the second fin structure are substantially coplanar.

21. The device of claim 17, wherein an aspect ratio of the respective first and second fin structures is at least 2:1.

22. A device comprising:
   a first fin structure having a first upper fin portion comprising a Group IV material on a first lower fin portion comprising a Group III-V material, wherein the first fin structure is confined within an aspect ratio trapping trench (ART trench) which has an aspect ratio of at least 2:1; and
   a second fin structure having a second upper fin portion comprising the Group IV material on a second lower fin portion comprising the Group III-V material, wherein a top surface of the first lower fin portion is substantially coplanar with a top surface of the second lower fin portion, and wherein the Group III-V material comprises gallium arsenide phosphide (GaAsP) and the Group IV material comprises silicon germanium (SiGe).

23. The device of claim 22, wherein the Group IV material is included within a PMOS or NMOS structure.

24. The device of claim 22, wherein the first upper fin portion has a lattice structure that substantially matches that of the first lower fin portion and the second upper fin portion has a lattice structure that substantially matches that of the second lower fin portion.

25. The device of claim 22, wherein the top of the first fin structure and the top of the second fin structure are substantially coplanar.

\* \* \* \* \*